(12) United States Patent
Bernds et al.

(10) Patent No.: US 7,875,975 B2
(45) Date of Patent: Jan. 25, 2011

(54) ORGANIC INTEGRATED CIRCUIT COMPLETELY ENCAPSULATED BY MULTI-LAYERED BARRIER AND INCLUDED IN RFID TAG

(75) Inventors: Adolf Bernds, Baiersdorf (DE); Wolfgang Clemens, Puschendorf (DE); Walter Fix, Fürth (DE); Henning Rost, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 329 days.

(21) Appl. No.: 10/344,926

(22) PCT Filed: Aug. 17, 2001

(86) PCT No.: PCT/DE01/03164

§ 371 (c)(1),
(2), (4) Date: Jul. 25, 2003

(87) PCT Pub. No.: WO02/15264

PCT Pub. Date: Feb. 21, 2002

(65) Prior Publication Data

US 2004/0026689 A1    Feb. 12, 2004

(30) Foreign Application Priority Data

Aug. 18, 2000   (DE) ................. 100 40 442
Apr. 27, 2001   (DE) ................. 101 20 685
Apr. 27, 2001   (DE) ................. 101 20 687

(51) Int. Cl.
*H01L 23/29*   (2006.01)
*H01L 23/31*   (2006.01)

(52) U.S. Cl. ............. 257/724; 257/788; 257/40; 257/E23.119; 257/E23.124

(58) Field of Classification Search ............ 257/40, 257/679, 701, 702, 723, 724, 728, 729, 730, 257/787, 788, E23.002, E23.116, E23.117, 257/E23.119, E23.123, E23.124, E23.126; 340/572.1; 250/370.14; 428/690
See application file for complete search history.

(56) References Cited

U.S. PATENT DOCUMENTS 3,512,052 A   5/1970   MacIver et al.
3,769,096 A   10/1973   Ashkin (Continued)

FOREIGN PATENT DOCUMENTS

DE   33 38 597   5/1985

(Continued)

OTHER PUBLICATIONS

Translation of the priority document DE 100 40442.1.*

(Continued)

*Primary Examiner*—Lynne A Gurley
*Assistant Examiner*—Andrew O Arena
(74) *Attorney, Agent, or Firm*—Carella, Byrne et al.; Elliot M. Olstein; Willaim Squire

(57) ABSTRACT

An electronic circuit having at least one electronic component comprised of an organic material, and arranged between at least two layers forming a barrier, wherein the layers protect the at least one component against an influence of light, air or liquid.

26 Claims, 5 Drawing Sheets

U.S. PATENT DOCUMENTS

| | | | |
|---|---|---|---|
| 3,955,098 | A | 5/1976 | Kawamoto |
| 4,302,648 | A | 11/1981 | Sado et al. |
| 4,340,657 | A | 7/1982 | Rowe |
| 4,442,019 | A | 4/1984 | Marks |
| 4,865,197 | A | 9/1989 | Craig |
| 4,926,052 | A * | 5/1990 | Hatayama et al. ...... 250/370.14 |
| 5,173,835 | A | 12/1992 | Cornett et al. |
| 5,206,525 | A | 4/1993 | Yamamoto et al. |
| 5,259,926 | A | 11/1993 | Kuwabara et al. |
| 5,321,240 | A | 6/1994 | Takihira |
| 5,347,144 | A | 9/1994 | Garnier et al. |
| 5,364,735 | A | 11/1994 | Akamatsu et al. |
| 5,395,504 | A | 3/1995 | Saurer et al. |
| 5,480,839 | A | 1/1996 | Ezawa et al. |
| 5,486,851 | A | 1/1996 | Gehner et al. |
| 5,502,396 | A | 3/1996 | Desarzens |
| 5,546,889 | A | 8/1996 | Wakita et al. |
| 5,569,879 | A | 10/1996 | Gloton et al. |
| 5,574,291 | A | 11/1996 | Dodabalapur et al. |
| 5,578,513 | A | 11/1996 | Maegawa |
| 5,580,794 | A | 12/1996 | Allen |
| 5,629,530 | A | 5/1997 | Brown et al. |
| 5,630,986 | A | 5/1997 | Charlton et al. |
| 5,652,645 | A | 7/1997 | Jain |
| 5,691,089 | A | 11/1997 | Smayling |
| 5,729,428 | A | 3/1998 | Sakata et al. |
| 5,854,139 | A | 12/1998 | Aratani et al. |
| 5,869,972 | A | 2/1999 | Birch et al. |
| 5,892,244 | A | 4/1999 | Tanaka et al. |
| 5,946,551 | A | 8/1999 | Dimitrakopoulos |
| 5,967,048 | A | 10/1999 | Fromson et al. |
| 5,970,318 | A | 10/1999 | Choi et al. |
| 5,973,598 | A * | 10/1999 | Beigel ...................... 340/572.1 |
| 5,997,817 | A | 12/1999 | Crismore et al. |
| 6,036,919 | A | 3/2000 | Thym et al. |
| 6,045,977 | A | 4/2000 | Chandross et al. |
| 6,060,338 | A | 5/2000 | Tanaka et al. |
| 6,083,104 | A | 7/2000 | Choi |
| 6,087,196 | A | 7/2000 | Sturm et al. |
| 6,133,835 | A | 10/2000 | DeLeeuw et al. |
| 6,150,668 | A | 11/2000 | Bao et al. |
| 6,197,663 | B1 | 3/2001 | Chandross et al. |
| 6,207,472 | B1 | 3/2001 | Calligari et al. |
| 6,215,130 | B1 | 4/2001 | Dodabalapur |
| 6,221,553 | B1 | 4/2001 | Wolk et al. |
| 6,251,513 | B1 | 6/2001 | Rector et al. |
| 6,284,562 | B1 | 9/2001 | Batlogg et al. |
| 6,300,141 | B1 | 10/2001 | Segal et al. |
| 6,321,571 | B1 | 11/2001 | Themont et al. |
| 6,322,736 | B1 | 11/2001 | Bao |
| 6,329,226 | B1 | 12/2001 | Jones et al. |
| 6,330,464 | B1 | 12/2001 | Colvin et al. |
| 6,335,539 | B1 | 1/2002 | Dimitrakopoulos et al. |
| 6,340,822 | B1 | 1/2002 | Brown et al. |
| 6,344,662 | B1 | 2/2002 | Dimitrakopoulos et al. |
| 6,362,509 | B1 | 3/2002 | Hart |
| 6,403,396 | B1 | 6/2002 | Gudesen et al. |
| 6,407,669 | B1 * | 6/2002 | Brown et al. ............. 340/572.1 |
| 6,429,450 | B1 | 8/2002 | Mutsaers et al. |
| 6,498,114 | B1 | 12/2002 | Amundson et al. |
| 6,506,438 | B2 * | 1/2003 | Duthaler et al. ............... 427/58 |
| 6,517,995 | B1 | 2/2003 | Jacobsen et al. |
| 6,555,840 | B1 | 4/2003 | Hudson et al. |
| 6,593,690 | B1 | 7/2003 | McCormick et al. |
| 6,603,139 | B1 | 8/2003 | Tessler et al. |
| 6,621,098 | B1 | 9/2003 | Jackson et al. |
| 6,852,583 | B2 | 2/2005 | Bernds et al. |
| 6,903,958 | B2 | 6/2005 | Bernds et al. |
| 2002/0018911 | A1* | 2/2002 | Bernius et al. .............. 428/690 |
| 2002/0022284 | A1 | 2/2002 | Heeger |
| 2002/0025391 | A1 | 2/2002 | Angelopoulos |
| 2002/0053320 | A1 | 5/2002 | Duthaler |
| 2002/0056839 | A1 | 5/2002 | Joo et al. |
| 2002/0068392 | A1 | 6/2002 | Lee et al. |
| 2002/0130042 | A1 | 9/2002 | Moerman et al. |
| 2002/0170897 | A1 | 11/2002 | Hall |
| 2002/0195644 | A1 | 12/2002 | Dodabalapur et al. |
| 2003/0059987 | A1 | 3/2003 | Sirringhaus et al. |
| 2003/0112576 | A1 | 6/2003 | Brewer et al. |
| 2003/0175427 | A1 | 9/2003 | Loo et al. |
| 2004/0002176 | A1 | 1/2004 | Xu |
| 2004/0013982 | A1 | 1/2004 | Jacobson et al. |
| 2004/0026689 | A1 | 2/2004 | Bernds et al. |
| 2004/0084670 | A1 | 5/2004 | Tripsas et al. |
| 2004/0211329 | A1 | 10/2004 | Funahata et al. |

FOREIGN PATENT DOCUMENTS

| | | |
|---|---|---|
| DE | 4243832 | 6/1994 |
| DE | 19852312 | 5/1999 |
| DE | 19816860 | 11/1999 |
| DE | 19918193 | 11/1999 |
| DE | 100 06 257 | 9/2000 |
| DE | 100062575 | 9/2000 |
| DE | 19921024 | 11/2000 |
| DE | 19933757 | 1/2001 |
| DE | 69519782 | 1/2001 |
| DE | 19935527 | 2/2001 |
| DE | 19937262 | 3/2001 |
| DE | 10012204 | 9/2001 |
| DE | 10033112 | 1/2002 |
| DE | 100 45 192 | 4/2002 |
| DE | 100 47 171 | 4/2002 |
| DE | 10043204 | 4/2002 |
| DE | 100 58 559 | 5/2002 |
| DE | 100 61 297 | 6/2002 |
| DE | 10061297 | 6/2002 |
| DE | 101 17 663 | 10/2002 |
| DE | 101 20 687 | 10/2002 |
| DE | 10219905 | 12/2003 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 442 123 A1 | 8/1991 |
| EP | 0442123 | 8/1991 |
| EP | 0460242 | 12/1991 |
| EP | 0501456 A2 | 9/1992 |
| EP | 0501456 A3 | 9/1992 |
| EP | 0511807 | 11/1992 |
| EP | 0528662 | 2/1993 |
| EP | 0685985 | 12/1995 |
| EP | 0716458 | 6/1996 |
| EP | 0 785 578 A2 | 7/1997 |
| EP | 0 785 578 A3 | 7/1997 |
| EP | 0 615 256 | 9/1998 |
| EP | 0962984 | 12/1999 |
| EP | 0966182 | 12/1999 |
| EP | 0979715 | 2/2000 |
| EP | 0981165 | 2/2000 |
| EP | 0989614 A2 | 3/2000 |
| EP | 1 052 594 | 11/2000 |
| EP | 1048912 | 11/2000 |
| EP | 1065725 A2 | 1/2001 |
| EP | 1065725 A3 | 1/2001 |
| EP | 1 083 775 | 3/2001 |
| EP | 1 102 335 A2 | 5/2001 |
| EP | 1 104 035 A2 | 5/2001 |
| EP | 1103916 | 5/2001 |
| EP | 1 134 694 | 9/2001 |
| EP | 1224999 | 7/2002 |
| EP | 1237207 | 9/2002 |
| EP | 1 318 084 | 6/2003 |
| FR | 2793089 | 11/2000 |

| | | |
|---|---|---|
| GB | 723598 | 2/1955 |
| GB | 2 058 482 | 4/1981 |
| JP | 54069392 | 6/1979 |
| JP | 60117769 | 6/1985 |
| JP | 61001060 | 1/1986 |
| JP | 61167854 | 7/1986 |
| JP | 362065477 A | 3/1987 |
| JP | 01169942 | 7/1989 |
| JP | 05152560 | 6/1993 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| WO | WO9316491 | 8/1993 |
| WO | WO9417556 | 8/1994 |
| WO | WO 95/06240 | 3/1995 |
| WO | WO95/31831 | 11/1995 |
| WO | WO9602924 | 2/1996 |
| WO | WO 96/19792 | 6/1996 |
| WO | WO 97/12349 | 4/1997 |
| WO | WO9718944 | 5/1997 |
| WO | WO9818156 | 4/1998 |
| WO | WO9818186 | 4/1998 |
| WO | WO9840930 | 9/1998 |
| WO | WO9907189 | 2/1999 |
| WO | WO9910929 | 3/1999 |
| WO | WO9910939 | 3/1999 |
| WO | WO9921233 | 4/1999 |
| WO | PCT/IB98/01843 | 6/1999 |
| WO | WO9940631 | 8/1999 |
| WO | PCT/US99/07853 | 10/1999 |
| WO | WO9954936 | 10/1999 |
| WO | WO 99/66540 | 12/1999 |
| WO | WO 00/33063 | 6/2000 |
| WO | WO0036666 | 6/2000 |
| WO | WO0079617 | 12/2000 |
| WO | WO 01/03126 | 1/2001 |
| WO | WO 01/06442 | 1/2001 |
| WO | WO0108241 | 2/2001 |
| WO | WO 01/15233 | 3/2001 |
| WO | WO 01/17029 | 3/2001 |
| WO | WO0115233 | 3/2001 |
| WO | WO0117041 | 3/2001 |
| WO | WO0127998 | 4/2001 |
| WO | WO 01/46987 | 6/2001 |
| WO | WO0147044 A2 | 6/2001 |
| WO | WO0147044 A3 | 6/2001 |
| WO | WO0147045 | 6/2001 |
| WO | WO0173109 A2 | 10/2001 |
| WO | WO0173109 A3 | 10/2001 |
| WO | WO 02/05360 | 1/2002 |
| WO | WO0205361 | 1/2002 |
| WO | WO 02/15264 | 2/2002 |
| WO | WO0219443 | 3/2002 |
| WO | WO 02/29912 | 4/2002 |
| WO | WO 02/43071 | 5/2002 |
| WO | WO0247183 | 6/2002 |
| WO | WO02065557 A1 | 8/2002 |
| WO | WO 02/71139 | 9/2002 |
| WO | WO 02/071505 | 9/2002 |
| WO | WO 02/076924 | 10/2002 |
| WO | WO 02/091495 | 11/2002 |
| WO | WO02095805 A2 | 11/2002 |
| WO | WO02095805 A3 | 11/2002 |
| WO | WO 02/099908 | 12/2002 |
| WO | WO 0299907 | 12/2002 |
| WO | WO 03/046922 | 6/2003 |
| WO | WO 03/069552 | 8/2003 |
| WO | WO03067680 | 8/2003 |
| WO | WO 03/081671 | 10/2003 |
| WO | WO 03/095175 | 11/2003 |
| WO | WO 2004/032257 | 4/2004 |
| WO | WO 2004/042837 A2 | 5/2004 |
| WO | WO 2004/042837 A3 | 5/2004 |
| WO | WO2004042837 | 5/2004 |
| WO | WO2004007194 A2 | 6/2004 |
| WO | WO2004007194 A3 | 6/2004 |
| WO | WO2004047144 A2 | 6/2004 |
| WO | WO2004047144 A3 | 6/2004 |
| WO | WO 2004/083859 | 9/2004 |

OTHER PUBLICATIONS

Certified English-Language Translation (dated Dec. 16, 2008) of Foreign Priority document (dated Aug. 18, 2000) DE 10040442.1 (translation already on record).*
PCT International Search Report PCT/DE01/03164, Aug. 18, 2000, Siemens.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Dai, L. et al., "$I_2$-"Doping of 1,4-Polydienes, Elsevier Science S.A., Synthetic Metals 69 (1995), pp. 563-566.
Dai, L. et al., "Conjugation of Polydienes by Oxidants Other Than Iodine", Elsevier Science S.A., Synthetic Metals 86 (1997) 1893-1894.
Gosain, D.P., "Excimer laser crystallized poly-Si TFT's on plastic substrates", Second International Symposium on Laser Precision Microfabrication, May 16-18, 2001, Singapore, vol. 4426, pp. 394-400.
Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.
Koezuka, H. et al., "Macromolecular Electronic Device", Mol. Cryst. Liq. Cryst. 1994, vol. 2555, pp. 221-230.
Lu, Wen et al., "Use of Ionic Liquids for π-Conjugated Polymer Electrochemical Devices", Science, vol. 297, 2002, pp. 983-987.
Qiao, X. et al., "The FeCI3-doped poly3-alkithiophenes) in solid state", Elsevier Science, Synthetic Metals 122 (2001) pp. 449-454.
Shaheen, S.E., et al., "Low band-gap polymeric photovoltaic devices", Synthetic Metals, vol. 121, 2001, pp. 1583-1584.
Takashima, W. et al., Electroplasticity Memory Devices Using Conducting Polymers and Solid Polymer Electrolytes, Polymer International, Melbourne, 1992, pp. 249-253.
Velu, G. et al. "Low Driving Voltages and Memory Effect in Organic Thin-Film Transistors With A Ferroelectric Gate Insulator". Applied Physics Letters, American Institute of Physics, New York, Vo.l 79, No. 5, 2001, pp. 659-661.
Wang, Hsing Lin et al., Conducting Polymer Blends: Polythiophene and Polypyrrole Blends with Polystyrene and Poly (bisphenol A carbonate), American Chemical Society, 1990 pp. 1053-1059.
Wang, Yading et al., "Electrically Conductive Semiinterpenetrating Polymer Networks of Poly(3-octylthiophene)", Macromolecules 1992, vol. 25, pp. 3284-3290.
U.S. Appl. No. 10/541,815, Axel Gerit et al.
U.S. Appl. No. 10/541,956, Wolfgang Clemens et al.
U.S. Appl. No. 10/541,957, Walter Fix et al.
U.S. Appl. No. 10/543,561, Wolfgang Clemens et al.
U.S. Appl. No. 10/542,678, Adolf Bernds et al.
U.S. Appl. No. 10/542,679, Adolf Bernds et al.
U.S. Appl. No. 10/562,989, filed Jun. 29, 2006, Jurgen Ficker et al.
U.S. Appl. No. 10/562,869, filed Oct. 5, 2006, Walter Fix et al.
U.S. Appl. No. 10/569,763, Walter Fix et al.
U.S. Appl. No. 10/568,730, Feb. 8, 2007, Wolfgang Clemens et al.
U.S. Appl. No. 10/569,233, Jan. 25, 2007, Adolf Bernds et al.
U.S. Appl. No. 10/570,571, Jan. 11, 2017, Wolfgang Clemens et al.
U.S. Appl. No. 10/585,775, Walter Fix.

U.S. Appl. No. 11/574,139, Jurgen Ficker.
U.S. Appl. No. 10/362,932, Oct. 2, 2003, Adolf Bernds et al.
U.S. Appl. No. 10/380,113, Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, Dec. 30, 2004, Adolf Bernds et al.
U.S. Appl. No. 10/479,238, Adolf Bernds et al.
U.S. Appl. No. 10/492,922, Erwann Buillet et al.
U.S. Appl. No. 10/492,923, Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, May 19, 2005, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.
U.S. Appl. No. 10/524,646, Walter Fix et al.
U.S. Appl. No. 10/533,756, Wolfgang Clemens et al.
U.S. Appl. No. 10/534,678, Wolfgang Clemens et al.
U.S. Appl. No. 10/535,448, Wolfgang Clemens et al.
U.S. Appl. No. 10/535,449, Walter Fix et al.
U.S. Appl. No. 10/344,926, Adolf Bernds et al.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricatecd by Printing Techniques", Chem. Mater vol. 9, No. 6, 1997, pp. 1299-1301.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J. et al:, Low Voltage, 30 NM Channel Length, Organic Transistors With a Self-Assembled Monolayer As Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.
Crone, B. et al, "Large-scale complementary Integrated circuits based on Organic transistors", Nature, vol. 403, Feb. 3, 2000, pp. 521.
Dai, L. et al, Photochemical Generation of Conducting Pattersn in Polybutadiene Films:, Macromolecules, vol. 29, No. 1, 1996, pp. 282-287, XP001042019, the whole document.
De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, pp. 527-529.
Fix, W., et al., "Fast polymer integrated circuits", American Institute of Physics, Applied Physics Letters, vol. 81, No. 89, Aug. 2002, pp. 1735-1737.
Fraunhofer Magazin- Polytronic Chips Von der Rolle, 4.2001, pp. 8-13.
Garnier F et al:, "Vertical Devices Architecture by Molding of Organic-Based Thin Film Transistor", Applied Physics Letters, Appl. Phys. Lett. 73, 1721 (1998); doi:10.1063/1.122257.
Garnier et al., "Conjugated Polymers and Oligomers as Active Material for Electronic Devices", Synthetic Metals, vol. 28, 1989.
Gelinck, G.H. et al., "High-Performance All-Polymer Integrated Circuits", Applied Physics Letters, v. 77, 2000, pp. 1487-1489.
Halls, J.J. M., et al., "Efficient photodiodes from interpenetrating polymer networks", Nature, vol. 376, Aug. 10, 1995, pp. 498-500.
Harsanyi G. et al, "Polytronics for biogtronics:unique possibilities of polymers in biosensors and BioMEMS", IEEE Polytronic 2002 Conference, Jun. 23, 2002, pp. 211-215.
Hebner, T.R. et al., Ink-jet printing of doped polymers for organic light emitting devices:, American Institute of Physics, Applied Physics Letters, vol. 72, No. 5, Feb. 2, 1998, pp. 519-521.
Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.
IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.
Klauk, H. et al., "Fast Organic Thin Film Transistor Circuits", IEEE Electron Device Letters, vol. 20, No. 6, pp. 289-291, Jun. 1999.
Klauk, H. et al., "Pentacene Thin Film Transistors and Inverter Circuits", 1997 International Exectron Devices Meeting Technical Digest, pp. 539-542, Dec. 1997.
Knobloch, A. et al., "Printed Polymer Transistors" Proc. 1st Int IEEE Conf. Polymers and Adhesives in Microelectronics and Photonics, pp. 84-90, 2001.
Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.
Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.
Lidzey, D. G. et al., "Photoprocessed and Micropatterned Conjugated Polymer LEDs", Synthetic Metals, V. 82, 1996, pp. 141-148.
Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.
Lucent Technologies, "Innovation marks significant milestone in the development of electronic paper", Cambridge, MA and Murray Hill, NJ, Nov. 20, 2000. XP-002209726.
Manuelli, Alessandro et al., "Applicability of Coating Techniques for the Production of Organic Field Effect Transistors", IEEE Polytronic 2002 Conference, 2002, pp. 201-204.
Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.
Oelkrug, D. et al., "Electronic spectra of self-organized oligothiophene films with 'standing' and 'lying' molecular units", Elsevier Science S.A., 1996, Thin Solid Films 284-270.
Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.
Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.
Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., Polymer Diodes With High Rectification:, Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Schrodner M. et al., "Plastic electronics based on Semiconducting Polymers", First International IEEE Conference on Polymers and Adhesives in Microelectronics and Photonics. Incorporating Poly, Pep & Adhesives in Electronics. Proceedings (Cat. No. 01TH8592), First International IEEE Conference on Polymers and Adhesives in Micr, Seitenn 91-94, Oct. 2001.

Ullman, A. et al., "High Performance Organic Field-Effect Transistors and Integrated Inverters", Mat. Res. Soc. Symp. Proc., v. 665, 2001, pp. 265-270.

Yu, G. et al., "Dual-function semiconducting polymer devices: Light-emitting and photodetecting diodes", American Institute of Physics, Applied Physics Letter 64, Mar. 21, 1994, pp. 1540-1542.

Zheng, Xiang-Yang et al., "Electrochemical Patterning of the Surface of Insulators with Electrically Conductive Polymers", J. Electrochem. Soc., v. 142, 1995, pp. L226-L227.

* cited by examiner

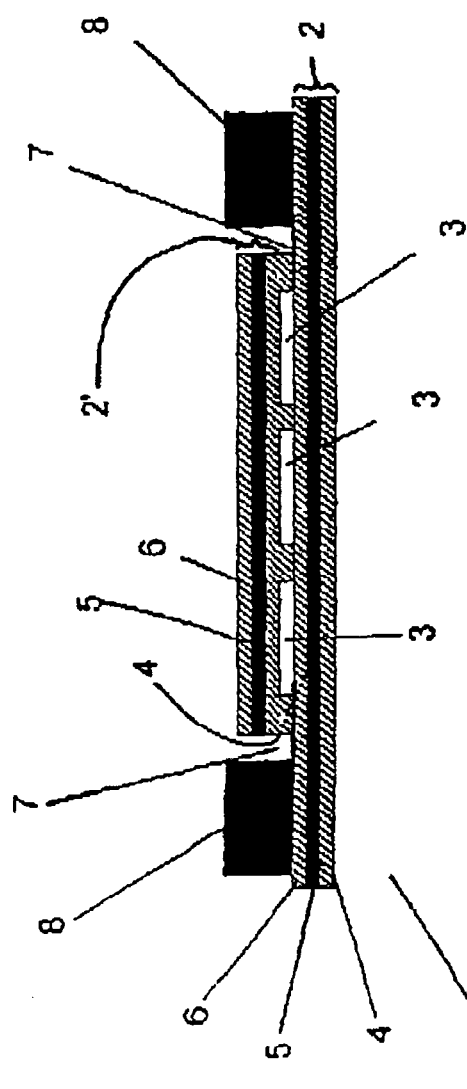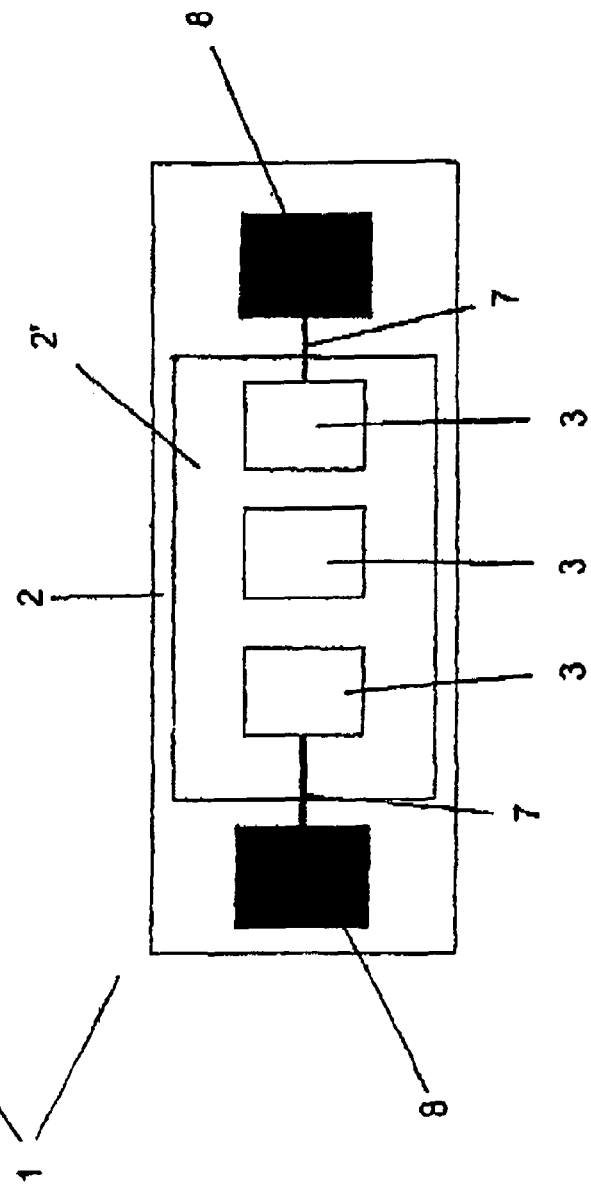

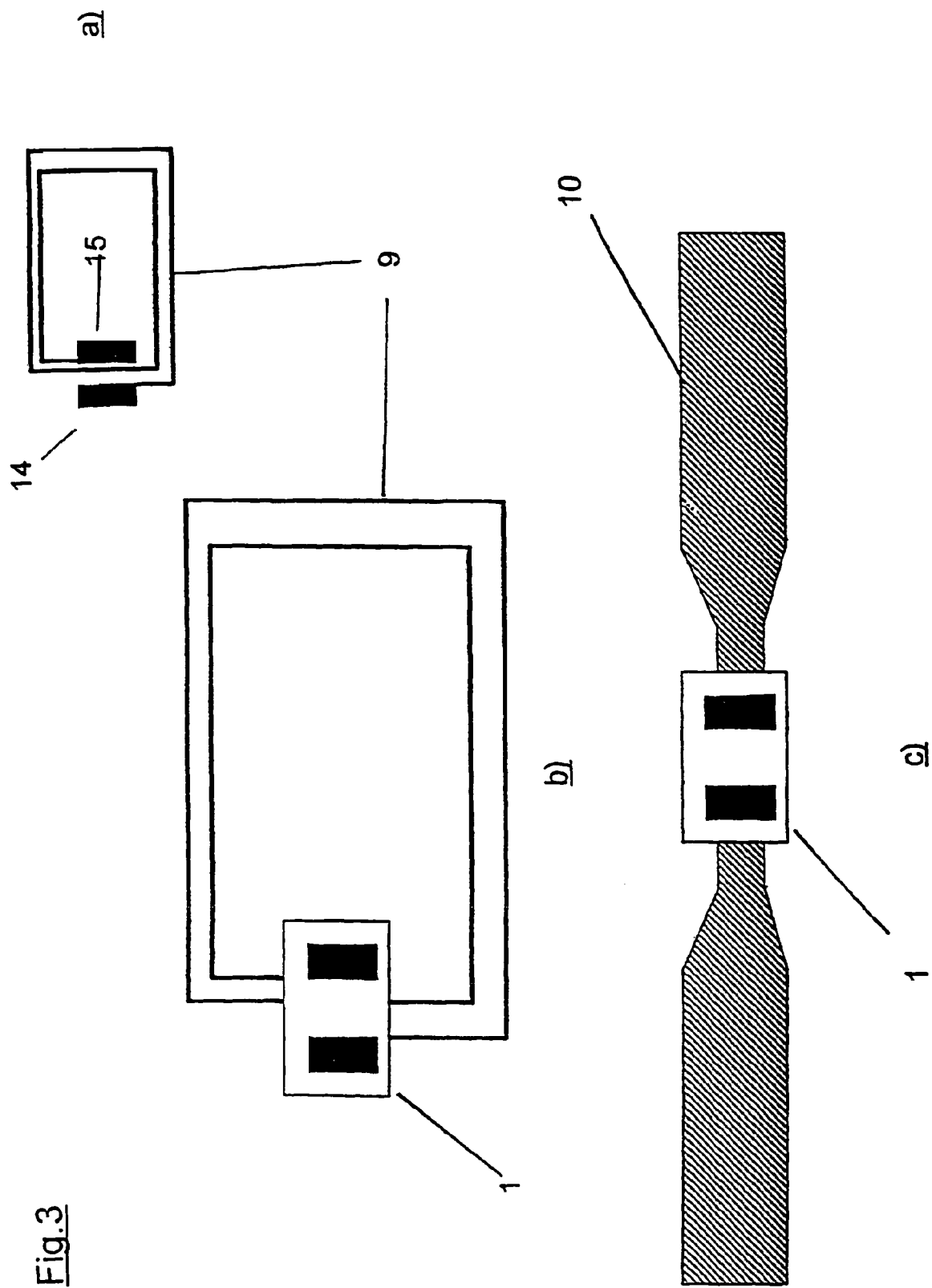

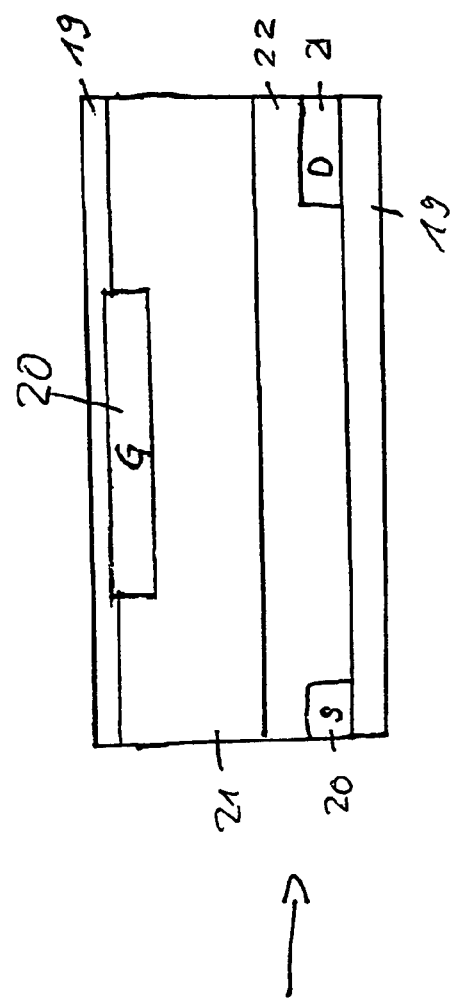
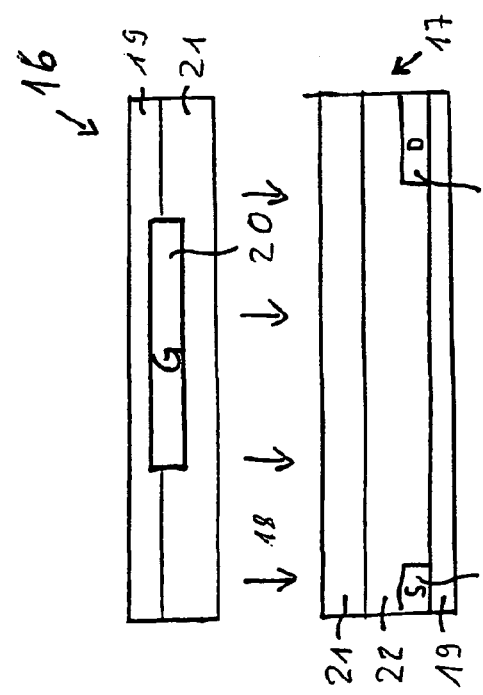

ORGANIC INTEGRATED CIRCUIT COMPLETELY ENCAPSULATED BY MULTI-LAYERED BARRIER AND INCLUDED IN RFID TAG

This application claims priority to PCT/DE01/0316 which is incorporated herein by reference in its entirety.

FIELD OF THE INVENTION

The present invention relates to an electronic circuit comprising an organic material that is hermetically sealed against light, air and/or water, and further relates to a method for producing the same and the use thereof as a tag, sensor or the like.

BACKGROUND

Radio-frequency identity tags ("RFID") are currently constructed with metallic coils and a silicon chip. They are used, for example, for logistical purposes, access controls or the like. RFID tags are intended to operate as passively as possible, without a battery. Energy is drawn from a coil that is activated by a resonating reader. In this manner, a memory in an electronic chip of the tag is activated and a stored item of information is read out, such as an identification of sender and an addressee in the case of logistical applications. On account of their relatively high production costs, RFID tags are not cost-effective for use in mass applications, such as for electronic bar coding, for protection against copying or cloning or for use in disposable articles.

The operable range of distance between the reader and the tag is determined in part by the power of radiation of the reader occurring at frequency ranges such as 125 kHz or 13.56 MHz, and is also determined by the size and quality of the coil or antenna of the tag. In the case of passive tags, this range is typically less than 60 cm. The construction of the coil in this instance depends greatly upon the carrier frequency used. For example, a wound coil with generally several hundred turns is used at a frequency of 125 kHz, while a flat coil of approximately ten turns is used in the case of a frequency of 13.56 MHz.

An example of a known organic field-effect transistor is provided in DE 100 40 442.1. Organic electronic circuits can be produced at very low cost. They are therefore suitable for the construction of tags that can be used in mass markets and with disposable products. Other conceivable applications include electronic tickets, electronic postage stamps, electronic watermarks, and applications for protection against theft or for baggage control.

Unfortunately, electronic circuits that are comprised of organic material are associated with two major disadvantages. First, organic materials are very sensitive to environmental influences, such as light, air and water, and age relatively quickly under this influence. Second, antennas produced by a polymer technique, or by any printing technique, are distinctly inferior to metallic antennas. The antennas have a higher electrical resistance and are of lower quality. As a result, such electronic components and tags based on organic materials have only a short service life and are suitable only for a very short range.

The problem concerning durability is comparable to that associated with organic light-emitting diodes, known as OLEDs. Presently, glass is used as the substrate for these diodes, and a glass plate is also adhesively attached over the components to ensure a good hermetic encapsulation. However, for mechanical reasons and reasons relating to cost, glass is not possible for the type of applications for which the present invention is generally directed. Conventional organic substrates are permeable to light, air and water and consequently are likewise not suitable. Metallized substrates, such as are used for example in the food packaging area or for the airtight packaging of sensitive materials, likewise do not come into consideration for RFID tags in particular, since the metal layer in the substrate prevents coupling of the coil to the reader. A Faraday cage or metallic shielding is created.

Accordingly, a substantial need exists for organic electronic circuits that are not especially sensitive to environmental influences and do not have problems associated with durability.

SUMMARY OF THE INVENTION

Embodiments of the present invention relate to an electronic circuit having an organic material and in which the electronic circuit is hermetically sealed against light, air and water to lessen problems associated with environmental sensitivity and aging. The electronic circuit can be produced simply and at low cost, such that tags produced from it can be used in mass markets and for disposable products and, in particular, can be combined with coils or antennas without metallic shielding occurring.

The present invention relates to an electronic circuit having at least one electronic component comprised of an organic material, and arranged between at least two layers forming a barrier, wherein the layers protect the at least one component against an influence of light, air or liquid.

The present invention additionally relates to a method for producing an electronic circuit having electronic components comprised of organic material. This includes steps of constructing a layer forming a barrier, arranging electronic components to form an electronic circuit upon the barrier layer, connecting electrical conductor tracks to electrical contacts, and applying an additional layer comprising at least one barrier layer over the electronic components to protect the components against light, air, or water.

The present invention also relates to a method for producing an electronic circuit comprising forming at least one source electrode and one drain electrode on a first substrate carrier and coating with a semiconducting layer, applying an uncross-linked insulator upon the layer, applying on a second substrate a gate electrode with a layer of uncross-linked insulator lying over the electrode, superposing the two carriers such that the two uncross-linked insulating layers come to lie one on top of each other, and initiating crosslinking of the insulators.

BRIEF DESCRIPTION OF THE DRAWINGS

The invention is explained in more detail below on the basis of the accompanying drawings, in which:

FIG. 1 illustrates an encapsulated electronic circuit according to an embodiment of the present invention;

FIG. 2 illustrates the electronic circuit represented in FIG. 1 in a schematic plan view;

FIGS. 3a, 3b and 3c illustrate the electronic circuit according to an embodiment of the present invention in combination with a coil or a rod antenna;

FIGS. 6 and 7 together illustrate the production of an OFET having a substructure with a source/drain electrode and a semiconducting layer and a superstructure with a gate electrode, where the two constructions are connected by means of an insulating layer.

DETAILED DESCRIPTION OF THE PREFERRED EMBODIMENTS

Figure 4:
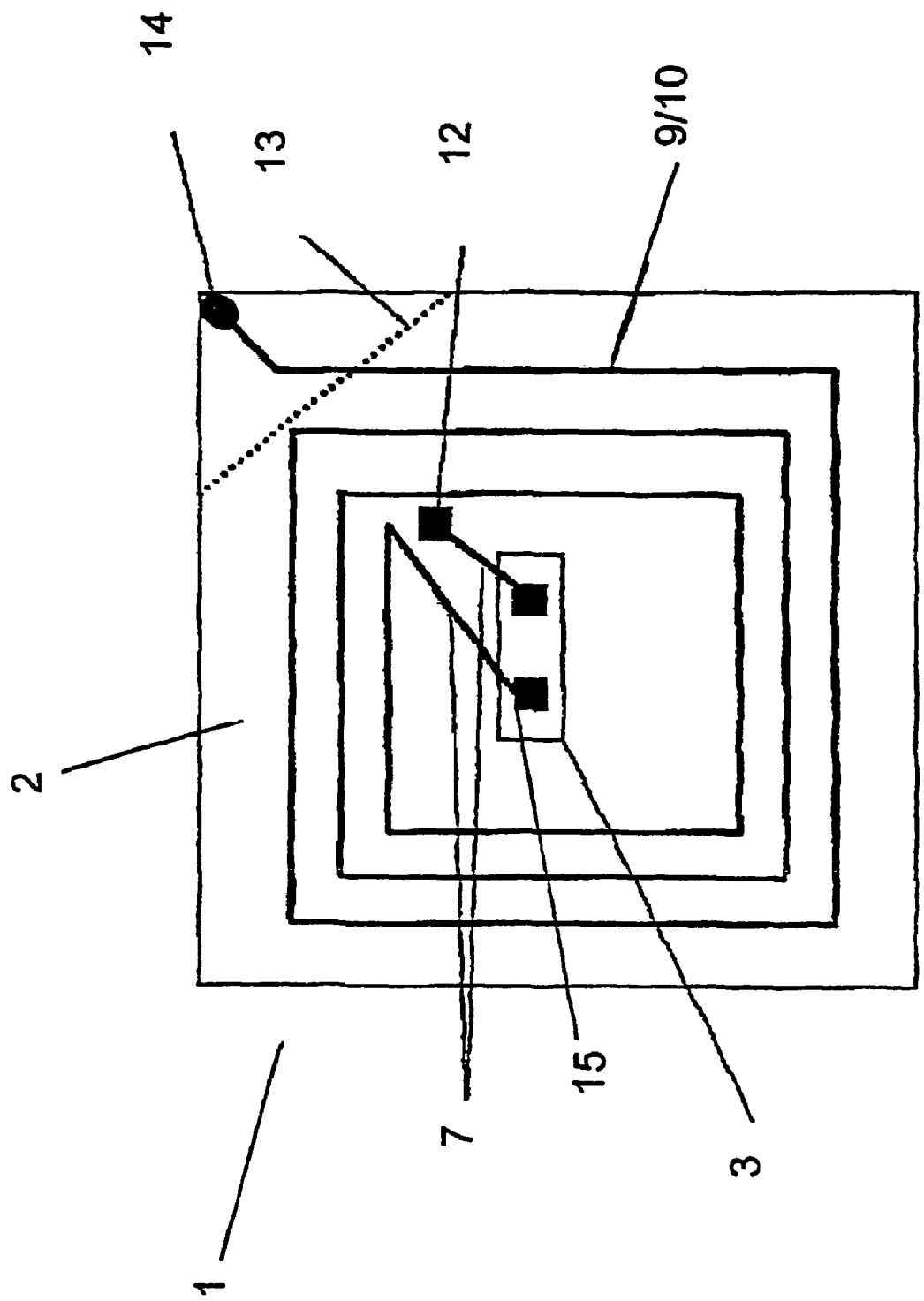
FIG. 4 illustrates an electronic circuit with a coil in accordance with an embodiment of the present invention.

Hereinafter, preferred embodiments of the present invention will be described in detail with reference to the attached drawings. This invention may be embodied in many different forms and should not be construed as being limited to the embodiments set forth herein.

The preferred embodiments relate to an electronic circuit having an organic material, which is hermetically sealed against light, air and water to lessen problems associated with environmental sensitivity and aging. The electronic circuit can be combined with coils or antennas without metallic shielding occurring.

The term "organic material" refers to all types of organic, metal-organic and/or inorganic plastics. It comprises all types of substances with the exception of the semiconductors which form the classic diodes (germanium, silicon) and the typical metallic conductors. Accordingly, a restriction in the dogmatic sense to organic material as carbonaceous material is not intended, envisaging rather the broad use of silicones, for example. Furthermore, the term is not intended to be subject to any restriction with regard to the molecular size, in particular to polymeric and/or oligomeric materials; instead, the use of "small molecules" is also entirely possible.

FIG. 1 is a schematic illustration of an electronic circuit 1 according to an embodiment of the invention, which comprises electronic components 3. These electronic components 3 may be constructed entirely or partly from organic materials, including conducting, semiconducting or nonconducting polymeric plastics. The electronic components 3 are arranged on a layer 2, which forms a barrier and is multi-layered, in the case of the illustrated embodiment. The electronic components 3 or chips may be adhesively bonded onto the layer 2 or otherwise may be held fixed in place upon it in some other manner. The components also may be formed directly upon the layer by suitable printing methods.

The layer 2 itself is constructed from three layers 4, 5 and 6. The lowermost layer 4 is a film of plastic, such as an organic polymer such as polyvinyl phenol, polymethylmethacrylate, polysulfone, polycarbonate, polyether ketone, polyethylene terephthalate, polyethylene, polyimide or any desired mixture of these polymers. The film of plastic usually has a thickness of between 10 and 100 μm, preferably 30-60 μm. The second layer 5 is formed as the actual barrier layer. This is preferably a metallic layer comprising aluminum, copper or chromium, which is either laminated as a film onto the layer 4 or has been vapor-deposited onto it. An applied metal layer is usually between 5 and 100 μm, preferably between 5 and 50 μm, thick. As already mentioned, the barrier layer may also comprise a non-metallic substrate. This non-metallic material is to be selected such that it picks up or absorbs light and/or water and/or oxygen. Suitable non-metallic coatings for forming a barrier layer against light, air and/or water are therefore, for example, layers consisting largely of dense particles which are arranged overlapping if at all possible. Suitable materials for this purpose form graphite or inorganic oxides with a platelet structure. A further layer 6 is in the form of a film of plastic and is adhesively bonded or laminated over the barrier layer 5. The film substrate may be transparent or else completely opaque. An opaque film even has the advantage that harmful influences of light in organic electronics are prevented in an optimum way.

Formed or arranged on this layer 2 along with the electronic components 3 are electrical contacts 8. The contacts serve for later connecting the electronic circuit 1 to a coil or antenna; for example, for the construction of an RFID tag. The contacts 8 may consist of organic, conductive materials and may be applied to the film substrate by a known printing method.

Metallic contacts, such as copper, may also be used for connection in an electrically-conducting manner to predetermined components among the electrical components 3 by lines 7. Arranged in a hermetically-sealing manner over the electronic components 3, and consequently partly over the lines 7, is a further barrier 2', which may have the same construction as the first layer 2.

Consequently, the exemplary embodiment is a multi-layered system, comprising two layers 4, 6 of a film of plastic, between which a barrier layer 5 is arranged. The materials for these layers may be selected from the same ones that can be used for the further layer 2. It is advantageous in the production process for this second upper and covering or encapsulating barrier layer as such either to be adhesively bonded or laminated on. It is evident that the individual electronic components are completely enclosed by the layers 2 and 2' and consequently optimally shielded against environmental influences.

In an advantageous configuration of the present invention, the barrier layer used for the encapsulation may comprise barrier layers of the same or different types. In other words, the layer(s) forming the barrier may, for example, combine a metallic barrier coating and a non-metallic barrier coating. In general, the layer forming the barrier may consequently be a multi-layered system. A suitable construction comprises, for example, a polyethylene terephthalate film which is coated with aluminum, a further polyethylene terephthalate film being laminated onto the aluminum coating.

FIG. 2 illustrates the construction of the electronic circuit 1 from a plan view, from which in particular the electrical connection to the contacts 8 lying outside the encapsulation is shown.

The electronic circuit formed according to an embodiment of the invention may consequently comprise all the components essential for a circuit. Preferably, however, the active components are mainly encapsulated. These are, in particular, the integrated circuit, transistors, diodes and especially rectifier diodes or similar active components. It is preferred for the active components to consist at least partly of organic material.

Passive components, such as resistors, capacitors or coils, may also be included by the electronic circuit according to the invention. Equally, only the sensitive components, such as the organic integrated circuit itself, may be included and other parts, such as for example a rectifier diode, may be located outside, in which case they may still be produced by the conventional silicon technique.

The electronic encapsulated circuit according to the invention can be used not only for tags but in all applications where a metallized substrate does not preclude use, that is for example also in the case of sensors or other electronic components which can be realized by organic electronics.

One particular advantage is obtained in the case where systems of layers or systems of films with metal layers are used for the film substrates. In this case, the metal layers may also be integrated into the corresponding circuit, for example formed by suitable structuring as electrical conductors or else as passive components such as capacitors, coils or resistors.

FIG. 3 illustrates how to achieve a greater antenna range of an antenna of an RFID tag, for example, as compared with a complete integration of the organic electronics with the coil, despite metallized encapsulation of the electronic circuit 1. The electronics are constructed such that they can be fastened as a kind of sticker, with the exposed electrical contacts on a corresponding coil or antenna 9, 10. The respective ends of the coil (FIG. 3(a) and FIG. 3(b)) or else its rod-shaped antenna (FIG. 3(c)) can be connected to the encapsulated electronics by simply adhesively bonding them on. In this way, the entire construction provides a functioning tag.

In this embodiment, the electronics are separate from the coil. Therefore, a conventional metal antenna, which has a correspondingly high quality for as high a range as possible, can be used as the coil. It is also possible for very large antennas to be attached, without the economic disadvantage that the more complex technique for the production of the organic circuit is required only for a small part of the surface area.

A further production step that is generally necessary in the case of flat coils, including connection of the corresponding coil ends 14, 15 in a further plane, now becomes unnecessary. By omitting this step, inexpensive printing methods can be used to include antennas in the printing applied to the packaging and, in a final step, adhesively attach the stickers corresponding to the electronics described above.

It is advantageous that the corresponding electrical terminal areas are quite large, to allow simple adjustment. If the terminals are standardized, it is also possible for them to be applied at a later stage. As an example, this allows end users in the retail trade to attach their own tags. In this embodiment, even a metallized area of the overall electronics for the RF connection of the antenna is not problematical, since it lies over the coil turns and not in the area enclosed by the coil.

Figure 5:
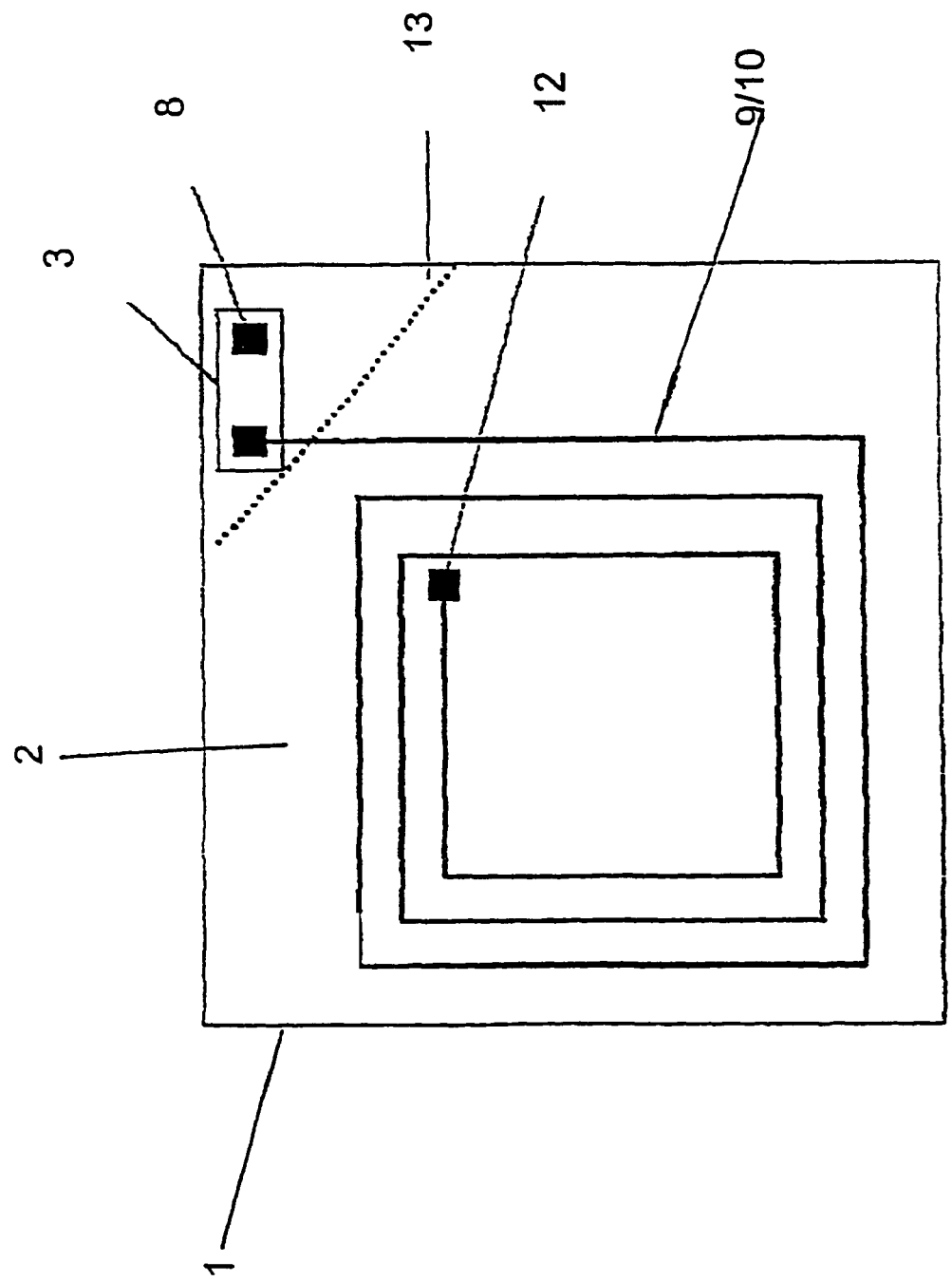
FIG. 5 illustrates an electronic circuit with a coil in accordance with a further embodiment of the present invention.

In the case of the embodiments according to FIGS. 4 and 5, the electronic circuit 1 according to the invention is combined with an antenna 9, 10 in a particularly efficient and cost-saving way. The Figures illustrate that the "transponder circuit" is applied directly on the substrate of the antenna 9, 10. A homogeneously metallized film of plastic 4, 5, such as polyethylene, polyethylene terephthalate or polyimide, with vapor-deposited aluminum, then is used as the barrier layer 2. A coil is produced on the metal layer 5 by a structuring process. At points where the actual circuit 3 is arranged, a metal layer is left, then serving as the barrier or encapsulation. It is also conceivable to introduce this metal layer directly into the circuit by corresponding structuring, for example as conductor tracks or as passive components. This results in a multi-layered system, in which one layer can be used for the encapsulation and one layer can be used for the application in the circuit. An advantage of this construction is that the entire identity tag can be produced as an integrated system, which in particular reduces costs.

In FIG. 4, an antenna 9, 10, which consists, for example, of a metal or a conducting polymer, is formed on a barrier layer 2, which may be formed as described above. In the interior of the antenna path there is an electronic circuit 1, for example, a silicon chip or a polymer chip, which is intended to be electronically connected to both ends 14, 15 of the antenna 9, 10. For this purpose, the corner 13 of the layer 2 represented by a dotted line is folded over in such a way that the end 14 of the antenna comes to lie on the contact area 12. After the folding over, the electrical circuit 3 is connected to the antenna 9, 10 via the conductor tracks 7. To prevent a short-circuit of the folded-over conductor track 7 with the antenna 9, 10, an insulating layer must be applied to the turns of the antenna 9, 10 before the folding over. This insulating layer may at the same time serve as an adhesive for permanently fixing the folded-over corner 13. This type of connection allows the previously customary method step, that is the additional application of a structured conductor track, to be saved.

According to FIG. 5, on the layer 2 there is an antenna 9, 10, as in FIG. 4. An electronic circuit 3 is arranged outside the antenna 9, 10 in a corner 13 of the layer 2. This corner 13 is then folded over in such a way that the contact area 8 comes to lie on the contacting area 12 of the antenna 9, 10. To prevent a short-circuit of the folded-over conductor track 7 with the antenna 9, 10, an insulating layer must be applied to the turns of the antenna 9, 10 before the folding over. This insulating layer may at the same time serve as an adhesive for permanently fixing the folded-over corner 13.

A special feature of this embodiment is that the folding-over operation has the effect on the one hand of connecting the electronic circuit 3 to the antenna 9, 10 and on the other hand, of encapsulating the electronic circuit 3, to be precise by the substrate material, which is to be suitably selected for this.

In FIG. 6, the superstructure 16 and substructure 17 can be seen separately on the left, the arrows 18 indicating the direction in which the two constructions are pressed one onto the other. The superstructure 16 comprises a substrate 19 such as a flexible PET film, on which there is a thin layer 20 of ITO (ITO=Indium Tin Oxide) structured in the form of a gate electrode. The gate electrode 20 is embedded into a layer 21, for example about 100 nm thick, of the uncross-linked insulating material poly(4-hydroxystyrene) (PHS) with the crosslinker hexamethoxymethyl melamine (HMMM). In this layer, the insulating material is still in an uncross-linked form, but contains the components necessary for crosslinking (crosslinker, i.e. HMMM, and a catalyst, for example camphor sulfonic acid (CSA)). The substructure 17 likewise has a substrate 19 with a structured layer 20 of ITO on it, which here forms the source and drain electrodes. The source/drain electrodes are embedded into a semiconducting layer 22, for example of poly-(3-octylthiopene) P3OT, as the active semiconductor material. On the semiconducting layer 22 there is an approximately 100 nm thick layer 21 of the insulating material PHS, likewise uncross-linked and with the components necessary for crosslinking (crosslinker and catalyst). The superstructure 16 and substructure 17 are pressed one onto the other (FIG. 7), in such a way that the two layers 21 come to lie one on top of the other and are superficially connected to each other. In this case, adjustment is carried out with the aid of adjustment marks (e.g., fixing coils, optical marks or crosses) in such a way that the source/drain and gate electrodes are located one above the other in the desired way. In a following step, the entire construction is irradiated or annealed at 130° C. for one hour and consequently fixed.

This produces an organic field-effect transistor on a substrate or a carrier with a source/drain electrode on the substrate embedded in a semiconducting layer with an uncross-linked adjoining layer of insulating material and a gate electrode adjoined by a covering layer.

Thus, a method for producing such an OFET includes the following steps:

at least one source electrode and one drain electrode are formed on a carrier and coated with a semiconducting layer, on which a layer with a still uncross-linked insulator is applied; a gate electrode with a layer of uncross-linked insulator lying over it is applied on a second substrate and the two carriers are then superposed in such a way that the two uncross-linked insulating layers come to lie one on top of the other and then the crosslinking of the insulator is initiated.

The separate production of the gate electrode on a second substrate and its adjustment on the substrate/source, drain electrode/semiconductor/insulator construction, presented for the first time in this embodiment, facilitates the construction of OFETs to the extent that there is no longer any structuring of the upper electrode (source/drain or gate, depending on the construction) by photolithography, in which the lower organic layers are attacked and/or incipiently dissolved. Moreover, the OFET produced in this way is encapsulated and consequently protected against mechanical damage and environmental influences.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

The invention claimed is:

1. An organic electronic integrated circuit comprising:
at least two continuous multi-layered barrier layers exhibiting no openings therethrough,
each of said at least two barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film,
a first of said barrier layers forming a substrate;
first and second electrical contacts on the substrate;
a plurality of electronic components on the substrate,
at least a portion of said electronic components comprising organic material;
a plurality of interconnections, said plurality of electronic components being electrically interconnected by said interconnections to form a circuit,
said circuit being coplanar with and ohmically connected to said first and second electrical contacts on the substrate,
at least a second of said barrier layers formed on the substrate such that said circuit is completely enclosed by and protected against said ambient environmental influence by said at least two barrier layers; and
said first and second electrical contacts being external said at least second barrier layer.

2. The electronic circuit of claim 1, further including an antenna comprising a conductor track on the substrate and terminating at said first and second electrical contacts.

3. An electronic circuit comprising:
at least two continuous multi-layered barrier layers exhibiting no openings therethrough,
each of said at least two barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film,
one of said barrier layers forming a substrate;
first and second electrical contacts on the substrate;
at least one electronic component on the substrate,
said at least one electronic component forms an organic field-effect transistor including source and drain electrodes above a first of said at least two continuous multi-layered barrier layers and embedded in a semiconducting layer with an adjoining layer of uncrosslinked polymer insulating material, a gate electrode embedded in the uncrosslinked polymer layer of insulating material, followed by the second of said continuous multi-layered barrier layers;
at least one interconnection electrically connected to said at least one electronic component to form a circuit,
said circuit being coplanar with and ohmically connected to said first and second electrical contacts on the substrate,
at least a second of said barrier layers formed on the substrate such that said circuit is completely enclosed by and protected against said ambient environmental influence by said at least two barrier layers; and
said first and second electrical contacts being external said at least second barrier layer.

4. The electronic circuit of claim 2 wherein the antenna is ohmically coupled to the first contact and includes a third contact, at least a portion of the antenna is folded over with the third contact in ohmic engagement with the second contact of the electronic circuit.

5. The electronic circuit of claim 3, wherein at least one of said components comprises:
a superstructure comprising a first upper substrate;
a gate electrode embedded in the first substrate;
a first polymer uncrosslinked insulating layer with the gate electrode embedded in the first insulating layer which underlies the first substrate; and
a substructure comprising:
a second polymer uncrosslinked insulating layer insulation layer;
a semiconductor layer underlying the second insulation layer;
spaced source and drain electrodes embedded in and underlying the semiconductor layer; and
a second lower substrate juxtaposed with and underlying the semiconductor layer and the source/drain electrodes;
the substructure and the super structure being attached to each other forming an interface therebetween
wherein adjustment marks are integrated in the polymer uncrosslinked insulating layers for aligning the superstructure to the substructure
with the gate electrode operatively coupled to the source/drain electrodes.

6. The electronic circuit of claim 3, wherein a first of said at least two barrier layers comprises a metallic layer below the semiconductor layer and laminated to a plastic film layer.

7. The electronic circuit of claim 6, wherein the metallic layer is selected from the group consisting of aluminum, copper or chromium.

8. The electronic circuit of claim 3 wherein:
the at least one electronic component is selected from active components; and
further comprises a plurality of interconnected electronic components; and
further including an antenna comprising a conductor track on the substrate and terminating at said first and second electrical contacts.

9. The electronic circuit of claim 8, wherein the at least one component comprises an integrated circuit or a rectifier diode.

10. The electronic circuit of claim 1 wherein the at least a portion of the plurality of electronic components is selected from passive components.

11. The electronic circuit of claim 1, wherein at least a portion of the plurality of electronic components is selected from the group consisting of passive components comprising resistors, capacitors or coils.

12. The electronic circuit of claim 1, further comprising a coil arrangement external the barrier layers and electrically combined with the electronic components to form an antenna coupled to the contacts on the substrate.

13. The electronic circuit of claim 3, further including an antenna comprising an electrically conductive track on the substrate external the barrier layers and terminating at said first and second contacts.

14. A method for producing an electronic circuit having electronic components comprised of organic material comprising:
forming a first continuous multi-layered barrier layer exhibiting no openings therethrough,
arranging a plurality of electronic components of an electronic integrated circuit on the first barrier layer;
forming first and second electrical contacts on the first barrier layer coplanar with the electronic components;
forming a plurality of coplanar electrical conductor tracks on the first barrier layer, thereby interconnecting the plurality of electric components to each other and to the contacts through said tracks;
forming at least a second continuous multi-layered barrier layer exhibiting no openings therethrough,
applying said at least a second barrier layer onto said first barrier layer over only a first portion of the interconnected electronic components and their interconnecting conductor tracks, thereby defining a second portion of the interconnected electronic components external the second barrier layer,
each of said barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film,
said first portion of electronic components being completely enclosed by and protected against said ambient environmental influence by said at least two barrier layers,
said first and second electrical contacts being external said at least second barrier layer,
said second portion of the interconnected electronic components extending beyond the region between said first and second barrier layers.

15. The method of claim 14, wherein the electronic circuit comprises an RFID transponder tag for transmission of an RFID signal.

16. The method of claim 14, wherein the electronic circuit comprises an electrical sensor for sensing an external parameter and converting the sensed parameter to an electrical signal.

17. The electronic circuit of claim 1 wherein the at least one electronic component is included in an RFID transponder tag circuit.

18. The electronic circuit of claim 1 wherein the at least one electronic component comprises an electronic sensor for applying sensed information electrical signals to the circuit.

19. A method for producing an electronic circuit having electronic components comprised of organic material comprising:
constructing a first continuous multi-layered barrier layer exhibiting no openings therethrough;
arranging electronic components to form an integrated electronic sensor circuit on said first barrier layer;
connecting electrical conductor tracks to electrical contacts on said first barrier layer and coupled to said electronic components to form said circuit;
applying a second continuous multi-layered barrier layer exhibiting no openings therethrough over the electronic components and their circuit,
said second barrier layer cooperating with the first barrier layer to protect the components and their circuit against light and external environmental atmospheric influences including at least one of air or liquid;
each of said barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film,
forming first and second contacts on said first barrier layer external the region between said first and second barrier layers and ohmically connecting said contacts to said circuit;
forming an antenna having first and second electrical terminals on said first barrier layer external the region between said first and second barrier layers for connection to respective corresponding ones of said first and second contacts; and
interconnecting the first and second contacts respectively with the first and second terminals by folding over a portion of the first barrier to interconnect at least one of said first and second contacts with a corresponding terminal.

20. The method of claim 19 including adhering the folded over first barrier to a portion of the first barrier with an electrically insulating adhesive.

21. The electronic circuit of claim 1 further including:
an antenna on the substrate, the antenna comprising a conductor track and terminating at first and second terminals;
the substrate including a folded over portion to electrically engage the first terminal with the first contact juxtaposed therewith;
the second terminal being in ohmic engagement with the second contact;

the folded over substrate portion being adhesively attached to the juxtaposed portion of the substrate with an electrically insulating adhesive layer.

22. An electronic circuit comprising:
at least two continuous multi-layered barrier layers exhibiting no openings therethrough,
each of said at least two barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film;
a first component comprising at least one electronic component;
a second component comprising at least one electronic component;
a further component comprising at least one electronic component;
interconnections electrically connecting said first component to said second component and to said further component;
said first component comprising organic material;
said first and said second components both being arranged between said at least two barrier layers;
wherein said at least two barrier layers protect said first component, said second component and said interconnections against said ambient environmental influence;
at least one conductor forming a portion of said interconnections,
said conductor being electrically connected to and coplanar with said first and second components,
said conductor being electrically connected to said further component,
said further component and at least a portion of said conductor being external the region between the at least two barrier layers;
two electrical contacts external the region between the barrier layers and coplanar with the electronic component and the interconnections; and
an antenna external the region between the at least two barrier layers ohmically connected to the two electrical contacts.

23. An electronic circuit comprising:
a plurality of electronic components,
at least one of said components comprises organic material;
interconnections electrically interconnecting said electronic components;
an output of said electronic components,
said output for outputting an electrical current signal;
at least two continuous multi-layered barrier layers exhibiting no openings therethrough,
each of said at least two barrier layers comprising three sublayers,
each of said three sublayers forming a continuous barrier to ambient environmental influences, said ambient environmental influences including at least one of air, liquid or light,
said three sublayers being a lowermost sub layer of plastic film, a second sublayer of metallic film, and a third sublayer of plastic film;
said electronic components and said interconnections being arranged between said at least two barrier layers;
wherein said at least two barrier layers cooperate to protect said plurality of components and said interconnections from said ambient environmental influence;
a pair of electrical contacts external the region between said at least two barrier layers,
said pair of electrical contacts being coplanar with the electronic components; and
an electrical device on one of said barrier layers and electrically coupled to said contacts,
said electrical device for receiving said electrical current signal from said output of said electronic components.

24. The circuit of claim 23 wherein the electrical device is an antenna.

25. The circuit of claim 24 wherein the antenna and the plurality of components are on a common substrate and one of the barrier layers comprises a multilayer construction of different materials.

26. The circuit of claim 24 wherein:
the antenna is an elongated conductor terminating at a further electrical contact;
the substrate having a fold for electrically connecting the further electrical contact to one of said pair of electrical contacts in juxtaposed relation.

* * * * *